(12) United States Patent
Alt

(10) Patent No.: US 8,909,510 B2
(45) Date of Patent: Dec. 9, 2014

(54) LFSR EMULATION

(75) Inventor: Daniel Edward Alt, Royston (GB)

(73) Assignee: MStar Semiconductor, Inc., Grand Cayman, KY (US)

( * ) Notice: Subject to any disclaimer, the term of this patent is extended or adjusted under 35 U.S.C. 154(b) by 1361 days.

(21) Appl. No.: 12/373,970

(22) PCT Filed: Jul. 16, 2007

(86) PCT No.: PCT/GB2007/002681
§ 371 (c)(1),
(2), (4) Date: Jan. 15, 2009

(87) PCT Pub. No.: WO2008/009912
PCT Pub. Date: Jan. 24, 2008

(65) Prior Publication Data
US 2009/0254333 A1    Oct. 8, 2009

(30) Foreign Application Priority Data

Jul. 17, 2006 (GB) .................................. 0614157.6

(51) Int. Cl.
*G01R 31/28* (2006.01)
*G06F 9/455* (2006.01)
*H03M 13/09* (2006.01)
*H03M 13/00* (2006.01)
*G06F 7/58* (2006.01)
*G06F 17/50* (2006.01)

(52) U.S. Cl.
CPC .............. *H03M 13/091* (2013.01); *G06F 9/455* (2013.01); *G06F 17/5009* (2013.01); *H03M 13/616* (2013.01); *G06F 2207/583* (2013.01); *G06F 7/584* (2013.01)
USPC ............................................ 703/23; 714/724

(58) Field of Classification Search
CPC ............................. G06F 9/455; G06F 17/5009

USPC ............................................. 703/23; 714/724
See application file for complete search history.

(56) References Cited

U.S. PATENT DOCUMENTS 4,965,881 A * 10/1990 Dilley .......................... 380/268
5,910,907 A    6/1999 Chen et al.
(Continued)

FOREIGN PATENT DOCUMENTS

WO        2004/090714 A    10/2004

OTHER PUBLICATIONS

Weidong Lu, "A Fast CRC Update Implementation", 2003.*
(Continued)

*Primary Examiner* — Omar Fernandez Rivas
*Assistant Examiner* — Angel Calle
(74) *Attorney, Agent, or Firm* — Edell, Shapiro & Finnan, LLC

(57) ABSTRACT

Apparatus for emulating the operation of an LFSR having at least one of one or more inputs and one or more outputs, wherein the state of the LFSR can be described by a state vector having sections describing the input or inputs, if any, of the LFSR, the contents of the LFSR and the output or outputs, if any, of the LFSR, wherein the state vector can be multiplied by a time shift matrix to time shift the state specified by the vector and wherein the apparatus comprises means for multiplying a first instance of the state vector by the matrix to produce a second instance of the state vector that is time shifted relative to the first instance and wherein one or both of the input and output sections of the state vector are dimensioned to accommodate, respectively, inputs that arrive at different times during the time shift specified by the matrix and outputs that are produced at different times during the time shift.

20 Claims, 9 Drawing Sheets

(56) References Cited

U.S. PATENT DOCUMENTS

| | | | |
|---|---|---|---|
| 6,636,553 B1 | 10/2003 | Sriram | |
| 7,181,671 B2* | 2/2007 | Tsai et al. | 714/757 |
| 2004/0139133 A1 | 7/2004 | Yang et al. | |
| 2006/0020862 A1* | 1/2006 | Kang et al. | 714/726 |
| 2006/0269037 A1* | 11/2006 | Van Berkel et al. | 377/64 |

OTHER PUBLICATIONS

Lu, W. et al., "A Fast CRC Update Implementation," Internet Article (Online), XP002453556, Oct. 29, 2003, pp. 113-120; Retrieved from the Internet: URL:http://ce.et.tude1ft.nl/publicationfiles/> on Oct. 2, 2007.

Campobello, G. et al., "Parallel CRC Realization," IEEE Transactions on Computers, IEEE Service Center, Los Alamitos, CA, US, vol. 52, No. 10, Oct. 2003, XP011102010, ISSN: 0018-9340, pp. 1312-1319.

Chowdhury, S. et al., "Efficient Software Implementation of LFSR and Boolean Function and Its Application in Nonlinear Combiner Model," XP002456460, ISBN: 978-3-540-20208-0, Springer-Verlag Berlin Heidelberg, 2003, pp. 387-402.

* cited by examiner $g_{CRC24}(D) = D^{24} + D^{23} + D^6 + D^5 + D + 1$

Figure 2

PRIOR ART

|  (8-1) $V_s \rightarrow V'_s$  |  (8-2) $V_{o(17:32)} \rightarrow V'_s$  |
|---|---|
| 0 0 0 0 0 0 0 0 0 0 1 0 1 1 0 1 | 0 0 0 0 0 0 0 0 0 0 0 0 0 0 0 0 |
| 1 0 0 0 0 0 0 0 0 0 0 0 0 0 0 0 | 0 0 0 0 0 0 0 0 0 0 0 0 0 0 0 0 |
| 0 1 0 0 0 0 0 0 0 0 0 0 0 0 0 0 | 0 0 0 0 0 0 0 0 0 0 0 0 0 0 0 0 |
| 0 0 1 0 0 0 0 0 0 0 0 0 0 0 0 0 | 0 0 0 0 0 0 0 0 0 0 0 0 0 0 0 0 |
| 0 0 0 1 0 0 0 0 0 0 0 0 0 0 0 0 | 0 0 0 0 0 0 0 0 0 0 0 0 0 0 0 0 |
| 0 0 0 0 1 0 0 0 0 0 0 0 0 0 0 0 | 0 0 0 0 0 0 0 0 0 0 0 0 0 0 0 0 |
| 0 0 0 0 0 1 0 0 0 0 0 0 0 0 0 0 | 0 0 0 0 0 0 0 0 0 0 0 0 0 0 0 0 |
| 0 0 0 0 0 0 1 0 0 0 0 0 0 0 0 0 | 0 0 0 0 0 0 0 0 0 0 0 0 0 0 0 0 |
| 0 0 0 0 0 0 0 1 0 0 0 0 0 0 0 0 | 0 0 0 0 0 0 0 0 0 0 0 0 0 0 0 0 |
| 0 0 0 0 0 0 0 0 1 0 0 0 0 0 0 0 | 0 0 0 0 0 0 0 0 0 0 0 0 0 0 0 0 |
| 0 0 0 0 0 0 0 0 0 1 0 0 0 0 0 0 | 0 0 0 0 0 0 0 0 0 0 0 0 0 0 0 0 |
| 0 0 0 0 0 0 0 0 0 0 1 0 0 0 0 0 | 0 0 0 0 0 0 0 0 0 0 0 0 0 0 0 0 |
| 0 0 0 0 0 0 0 0 0 0 0 1 0 0 0 0 | 0 0 0 0 0 0 0 0 0 0 0 0 0 0 0 0 |
| 0 0 0 0 0 0 0 0 0 0 0 0 1 0 0 0 | 0 0 0 0 0 0 0 0 0 0 0 0 0 0 0 0 |
| 0 0 0 0 0 0 0 0 0 0 0 0 0 1 0 0 | 0 0 0 0 0 0 0 0 0 0 0 0 0 0 0 0 |
| 0 0 0 0 0 0 0 0 0 0 0 0 0 0 1 0 | 0 0 0 0 0 0 0 0 0 0 0 0 0 0 0 0 |

|  (8-3) $V_s \rightarrow V'_{o(17:32)}$  |  (8-4) $V_{o(17:32)} \rightarrow V'_{o(17:32)}$  |
|---|---|
| 0 0 0 0 0 0 0 0 0 0 0 0 0 0 0 1 | 0 0 0 0 0 0 0 0 0 0 0 0 0 0 0 0 |
| 0 0 0 0 0 0 0 0 0 0 0 0 0 0 0 0 | 1 0 0 0 0 0 0 0 0 0 0 0 0 0 0 0 |
| 0 0 0 0 0 0 0 0 0 0 0 0 0 0 0 0 | 0 1 0 0 0 0 0 0 0 0 0 0 0 0 0 0 |
| 0 0 0 0 0 0 0 0 0 0 0 0 0 0 0 0 | 0 0 1 0 0 0 0 0 0 0 0 0 0 0 0 0 |
| 0 0 0 0 0 0 0 0 0 0 0 0 0 0 0 0 | 0 0 0 1 0 0 0 0 0 0 0 0 0 0 0 0 |
| 0 0 0 0 0 0 0 0 0 0 0 0 0 0 0 0 | 0 0 0 0 1 0 0 0 0 0 0 0 0 0 0 0 |
| 0 0 0 0 0 0 0 0 0 0 0 0 0 0 0 0 | 0 0 0 0 0 1 0 0 0 0 0 0 0 0 0 0 |
| 0 0 0 0 0 0 0 0 0 0 0 0 0 0 0 0 | 0 0 0 0 0 0 1 0 0 0 0 0 0 0 0 0 |
| 0 0 0 0 0 0 0 0 0 0 0 0 0 0 0 0 | 0 0 0 0 0 0 0 1 0 0 0 0 0 0 0 0 |
| 0 0 0 0 0 0 0 0 0 0 0 0 0 0 0 0 | 0 0 0 0 0 0 0 0 1 0 0 0 0 0 0 0 |
| 0 0 0 0 0 0 0 0 0 0 0 0 0 0 0 0 | 0 0 0 0 0 0 0 0 0 1 0 0 0 0 0 0 |
| 0 0 0 0 0 0 0 0 0 0 0 0 0 0 0 0 | 0 0 0 0 0 0 0 0 0 0 1 0 0 0 0 0 |
| 0 0 0 0 0 0 0 0 0 0 0 0 0 0 0 0 | 0 0 0 0 0 0 0 0 0 0 0 1 0 0 0 0 |
| 0 0 0 0 0 0 0 0 0 0 0 0 0 0 0 0 | 0 0 0 0 0 0 0 0 0 0 0 0 1 0 0 0 |
| 0 0 0 0 0 0 0 0 0 0 0 0 0 0 0 0 | 0 0 0 0 0 0 0 0 0 0 0 0 0 1 0 0 |
| 0 0 0 0 0 0 0 0 0 0 0 0 0 0 0 0 | 0 0 0 0 0 0 0 0 0 0 0 0 0 0 1 0 |

| (9-1) $V_s \to V'_s$ | (9-2) $V_{o(17:32)} \to V'_s$ |
|---|---|
| 1 1 0 1 1 1 1 0 1 1 0 0 1 0 0 0 | 0 0 0 0 0 0 0 0 0 0 0 0 0 0 0 0 |
| 0 1 1 0 1 1 1 1 0 1 1 0 0 1 0 0 | 0 0 0 0 0 0 0 0 0 0 0 0 0 0 0 0 |
| 0 0 1 1 0 1 1 1 1 0 1 1 0 0 1 0 | 0 0 0 0 0 0 0 0 0 0 0 0 0 0 0 0 |
| 0 0 0 1 1 0 1 1 1 1 0 1 1 0 0 1 | 0 0 0 0 0 0 0 0 0 0 0 0 0 0 0 0 |
| 1 0 0 0 1 1 0 1 1 1 1 1 1 0 1 0 | 0 0 0 0 0 0 0 0 0 0 0 0 0 0 0 0 |
| 0 1 0 0 0 1 1 0 1 1 1 1 1 1 0 1 | 0 0 0 0 0 0 0 0 0 0 0 0 0 0 0 0 |
| 1 0 1 0 0 0 1 1 0 1 1 0 1 0 0 0 | 0 0 0 0 0 0 0 0 0 0 0 0 0 0 0 0 |
| 0 1 0 1 0 0 0 1 1 0 1 1 0 1 0 0 | 0 0 0 0 0 0 0 0 0 0 0 0 0 0 0 0 |
| 0 0 1 0 1 0 0 0 1 1 0 1 1 0 1 0 | 0 0 0 0 0 0 0 0 0 0 0 0 0 0 0 0 |
| 0 0 0 1 0 1 0 0 0 1 1 0 1 1 0 1 | 0 0 0 0 0 0 0 0 0 0 0 0 0 0 0 0 |
| 1 0 0 0 1 0 1 0 0 0 1 0 0 0 0 0 | 0 0 0 0 0 0 0 0 0 0 0 0 0 0 0 0 |
| 0 1 0 0 0 1 0 1 0 0 0 1 0 0 0 0 | 0 0 0 0 0 0 0 0 0 0 0 0 0 0 0 0 |
| 0 0 1 0 0 0 1 0 1 0 0 0 1 0 0 0 | 0 0 0 0 0 0 0 0 0 0 0 0 0 0 0 0 |
| 0 0 0 1 0 0 0 1 0 1 0 0 0 1 0 0 | 0 0 0 0 0 0 0 0 0 0 0 0 0 0 0 0 |
| 0 0 0 0 1 0 0 0 1 0 1 0 0 0 1 0 | 0 0 0 0 0 0 0 0 0 0 0 0 0 0 0 0 |
| 0 0 0 0 0 1 0 0 0 1 0 1 0 0 0 1 | 0 0 0 0 0 0 0 0 0 0 0 0 0 0 0 0 |

| (9-3) $V_s \to V'_{o(17:32)}$ | (9-4) $V_{o(17:32)} \to V'_{o(17:32)}$ |
|---|---|
| 1 0 0 0 0 0 1 0 0 0 1 1 1 1 1 0 | 0 0 0 0 0 0 0 0 0 0 0 0 0 0 0 0 |
| 0 1 0 0 0 0 0 1 0 0 0 1 1 1 1 1 | 0 0 0 0 0 0 0 0 0 0 0 0 0 0 0 0 |
| 1 0 1 0 0 0 0 0 1 0 0 1 1 0 0 1 | 0 0 0 0 0 0 0 0 0 0 0 0 0 0 0 0 |
| 1 1 0 1 0 0 0 0 0 1 0 1 1 0 1 0 | 0 0 0 0 0 0 0 0 0 0 0 0 0 0 0 0 |
| 0 1 1 0 1 0 0 0 0 0 1 0 1 1 0 1 | 0 0 0 0 0 0 0 0 0 0 0 0 0 0 0 0 |
| 1 0 1 1 0 1 0 0 0 0 0 0 0 0 0 0 | 0 0 0 0 0 0 0 0 0 0 0 0 0 0 0 0 |
| 0 1 0 1 1 0 1 0 0 0 0 0 0 0 0 0 | 0 0 0 0 0 0 0 0 0 0 0 0 0 0 0 0 |
| 0 0 1 0 1 1 0 1 0 0 0 0 0 0 0 0 | 0 0 0 0 0 0 0 0 0 0 0 0 0 0 0 0 |
| 0 0 0 1 0 1 1 0 1 0 0 0 0 0 0 0 | 0 0 0 0 0 0 0 0 0 0 0 0 0 0 0 0 |
| 0 0 0 0 1 0 1 1 0 1 0 0 0 0 0 0 | 0 0 0 0 0 0 0 0 0 0 0 0 0 0 0 0 |
| 0 0 0 0 0 1 0 1 1 0 1 0 0 0 0 0 | 0 0 0 0 0 0 0 0 0 0 0 0 0 0 0 0 |
| 0 0 0 0 0 0 1 0 1 1 0 1 0 0 0 0 | 0 0 0 0 0 0 0 0 0 0 0 0 0 0 0 0 |
| 0 0 0 0 0 0 0 1 0 1 1 0 1 0 0 0 | 0 0 0 0 0 0 0 0 0 0 0 0 0 0 0 0 |
| 0 0 0 0 0 0 0 0 1 0 1 1 0 1 0 0 | 0 0 0 0 0 0 0 0 0 0 0 0 0 0 0 0 |
| 0 0 0 0 0 0 0 0 0 1 0 1 1 0 1 0 | 0 0 0 0 0 0 0 0 0 0 0 0 0 0 0 0 |
| 0 0 0 0 0 0 0 0 0 0 1 0 1 1 0 1 | 0 0 0 0 0 0 0 0 0 0 0 0 0 0 0 0 |

Figure 9

LFSR EMULATION

BACKGROUND

Scrambling-code generators and CRC generators and checkers are traditionally implemented in hardware as linear-feedback shift registers (LFSRs). However, such an implementation requires one clock cycle for every bit.

It is sometimes desirable to process the data more quickly, which can be done by taking advantage of the fact that an LFSR can be represented mathematically as a transfer matrix A, defined so that NextState=A*CurrentState (modulo 2), where NextState and CurrentState are column vectors representing the state of the LFSR. In this way, an LFSR can be emulated.

NB: The modulo 2 in the transfer function implies operations over GF(2) (i.e. everything is a bit and can only have the values 0 and 1), but this approach is certainly not limited to GF(2). However, this convention is used throughout this document since GF(2) is normally used in practical systems.

For CRC, or any LFSR whose next state and/or output depend on a data input, NextState and CurrentState have an extra element to represent the data input, in addition to the elements representing the LFSR state.

The LFSR can be made to step n times in a single clock cycle by raising A to the $n^{th}$ power: $NextState_n = A^n * CurrentState$ (modulo 2).

SUMMARY OF THE INVENTION

According to one aspect, the invention provides apparatus for emulating the operation of an LFSR having at least one of one or more inputs and one or more outputs, wherein the state of the LFSR can be described by a state vector having sections describing the input or inputs, if any, of the LFSR, the contents of the LFSR and the output or outputs, if any, of the LFSR, wherein the state vector can be multiplied by a time shift matrix to time shift the state specified by the vector and wherein the apparatus comprises means for multiplying a first instance of the state vector by the matrix to produce a second instance of the state vector that is time shifted relative to the first instance and wherein one or both of the input and output sections of the state vector are dimensioned to accommodate, respectively, inputs that arrive at different times during the time shift specified by the matrix and outputs that are produced at different times during the time shift.

The invention also consists in a method of emulating the operation of an LFSR having at least one of one or more inputs and one or more outputs, wherein the state of the LFSR can be described by a state vector having sections describing the input or inputs, if any, of the LFSR, the contents of the LFSR and the output or outputs, if any, of the LFSR, wherein the state vector can be multiplied by a time shift matrix to time shift the state specified by the vector and wherein the method comprises multiplying a first instance of the state vector by the matrix to produce a second instance of the state vector that is time shifted relative to the first instance and wherein one or both of the input and output sections of the state vector are dimensioned to accommodate, respectively, inputs that arrive at different times during the time shift specified by the matrix and outputs that are produced at different times during the time shift.

According to another aspect, the invention provides apparatus for emulating the operation of an LFSR having at least one of one or more inputs and one or more outputs, wherein the state of the LFSR can be described by a state vector having sections describing the input or inputs, if any, of the LFSR, the contents of the LFSR and the output or outputs, if any, of the LFSR, wherein the state vector can be multiplied by a time shift matrix to time shift the state specified by the vector and wherein the apparatus comprises means for multiplying a first instance of the state vector by the matrix to produce a second instance of the state vector that is time shifted relative to the first instance, wherein the multiplication extends only to those parts of the matrix that describe the impact of the LFSR content and input sections of first instance of the state vector upon the LFSR content and output sections of the second instance.

The invention also provides a method of emulating the operation of an LFSR having at least one or more inputs and one or more outputs, wherein the state of the LFSR can be described by a state vector having sections describing the input or inputs, if any, of the LFSR, the contents of the LFSR and the output or outputs, if any, of the LFSR, wherein the state vector can be multiplied by a time shift matrix to time shift the state specified by the vector and wherein the method comprises time shifting a first instance of the state vector to produce a second instance of the state vector by multiplying the first instance of the state vector with the matrix, said multiplication extending only to those parts of the matrix that describe the impact of the LFSR content and input sections of the first instance of the state vector upon the LFSR content and output sections of the second instance.

Thus, the state vector can be time shifted without a need to perform calculations for the effect of all sections of the time shift matrix on the state vector. Moreover, there is no need to associate storage with the apparatus for the purpose of storing the output section of the first instance of the state vector or the input section of the second instance of the state vector, with the result that it may be possible to reduce the amount of data storage that is required.

In certain embodiments, the time shift specified by the matrix extends to multiple cycles of the LFSR. In other embodiments, the time shift is one cycle of the LFSR. In certain embodiments, different versions of the matrix can be provided, each specifying a time shift of a different extent such that a time shift of a desired length can more easily be achieved.

In certain embodiments, the LFSR is a scrambling code generator. In other embodiments, the LFSR is a CRC checker. In yet other embodiments, the LFSR is a CRC generator. Of course, it will be apparent to the skilled person that the LFSR that is emulated by the invention may have other applications.

In certain embodiments, there will be an overlap between the LFSR content and output sections of the state vector. In recognition of this, the state vector may be shortened to eliminate the duplicated overlap, for example by eliminating from the output section of the state vector that part which is already present in the LFSR content section of the state vector. In certain embodiments, the emulation of the LFSR can be arranged to maximise the overlap between the LFSR content and output sections of the state vector so as to reduce the number of calculations that are required to perform the matrix multiplication.

Some general discussion of LFSRs and their properties is worthwhile at this point.

A generic LFSR will have several state bits (i.e. bits describing the content of the LFSR) and at least one of one or more data input bits, and one or more data output bits. The next state and the data output will depend on the current state and the data input. (Usually an LFSR will have either a single data input bit or a single data output bit, but not both. However, the present invention is not limited to these simpler cases.)

For an n-stepping LFSR with m state bits, p data input bits, and q data output bits a square transfer matrix A must be created. Its dimension will be that of a notional state vector V and it will represent the transformation required for a single step of the LFSR. For the completely general case, this vector will include one element for each state bit, n elements for each input bit (to allow n sets of inputs to be processed at once), and n elements for each output bit (to allow n sets of output bits to be produced at once), giving a total vector length of m+pn+qn. (For the more usual case of a single input or output bit, the vector length is m+n. If the LFSR is a simple shift register with feedback producing the shift input and with a single output the same as that shift input, the vector elements corresponding to the state and the output can, according to a feature of the present invention, be shared, reducing the vector length to max(m,n).)

The state vector V can be decomposed into three sub-vectors, each corresponding to one of the bit types: input ($V_i$ with pn elements), state ($V_s$ with m elements), and output ($V_o$ with qn elements). The single-stepping transfer matrix, A, will therefore have nine sections, each indicating the effect of one type of bit on the next state of one type of bit. (The case of a simple shift register with equal feedback and output discussed at the end of the previous paragraph will result in partial or complete overlap of $V_s$ and $V_o$. Other cases may also result in partial or complete overlap of $V_s$ and $V_o$.) The general form of the matrix A is shown in FIG. 14. In that Figure, an initial version 10 of the state vector V is multiplied by the A matrix 12 to produce a final version 14 of V that has been advanced by one cycle relative to the initial version 10. The $V_i$, $V_s$ and $V_o$ sub-vectors of the initial and final versions 10 and 14 are shown. The A matrix 12 is depicted as divided into the nine sections referred to above (these are labelled F-N), each being dimensioned such that the sub-vectors of the final version 14 are:

$$V'_i = F \cdot V_i + G \cdot V_s + H \cdot V_o$$

$$V'_s = I \cdot V_i + J \cdot V_s + K \cdot V_o$$

$$V'_o = L \cdot V_i + M \cdot V_s + N \cdot V_o$$

where $V_i$, $V_s$, $V_o$ are the sub-vectors of the initial version 10 and $V'_i$, $V'_s$, $V'_o$ are the sub-vectors of the final version 14.

The inventor has appreciated two interesting characteristics of the n-stepping transfer matrix $B = A^n$ (modulo 2): the input-bit section ($V'_i$) of the next state will be all zero, and the output-bit section ($V_o$) of the current state will not affect any part of the next state. This means that the n-stepping LFSR only needs storage elements for the section of the vector corresponding to the LFSR content ($V_s$), which is the same number of storage elements required by the original single-stepping LFSR. This assumes that storage is provided for the n input and n output cycles of the LFSR emulator in the stages the precede and follow, respectively, the LFSR emulator. In other words, some external storage elements may be needed to allow all pn input bits to be presented simultaneously, but these would usually be needed anyway and, similarly, some external storage may be needed to accept all qn output bits simultaneously, but again these would usually be needed anyway.

In general terms, the current invention implements, in certain embodiments, the n-step transfer function $V' = BV$, where V is the current state and V' is the next state, as follows. First assemble V by setting $V_i$ to the pn input bits, $V_s$ to the stored state, and $V_o$ to qn arbitrary bits. Then calculate V' from this V, noting that $V_o$ does not affect V' and that $V'_i$ is all zeroes regardless of V (thus $V_o$ and $V'_i$ need not physically exist).

Finally, split V' into its parts. $V'_i$ is ignored, $V'_s$ is the next value of the stored state, and $V'_o$ is the qn output bits. Thus an LFSR emulator can be made to do n steps in a single clock, including processing the input bits and generating the output bits associated with those steps, without requiring any additional storage elements, though the feedback logic is more complex.

As mentioned earlier, it will sometimes be desirable to support two or more different step sizes (for example, to do the last few bits of CRC processing when the total number of bits is not a multiple of n; this could also be handled by prepending zeroes to the data, but that is not always practical). This can be done by multiplexing one or more additional transfer matrices with B, each of which is A raised to the appropriate power (modulo 2). For the case of the $C = A^k$ (modulo 2), k<n, only the last pk bits of $V_i$ are relevant and only the first qk bits of $V'_o$ are valid. This will be apparent from the transfer matrix C: the irrelevant bits of $V_i$ will not contribute to $V'_s$ or $V'_o$ and the invalid bits of $V'_o$ will depend on $V_o$.

In some cases it will be desirable to redefine the output to maximise the overlap of $V_o$ and $V_s$. For example, in a scrambling code generator for which the LFSR is a pure shift register with the shift input a combination of the state bits and the output the first state element (i.e. the shift input delayed by one clock), maximum state and output sharing is possible only if the output is redefined to be the same as the state shift input. To make this produce the same scrambling code as the original, the initial LFSR state must be changed to make the second state equal to the defined initial state. This modified initial value is generally easy to determine.

For large n, direct computation of $B = A^n$ (modulo 2) is expensive. This will not be a problem, since B can be pre-computed. Furthermore, the computation can be done more efficiently, for example by expressing $A^n$ as a product of A raised to various powers of two, or by recursively defining $A^n$ as $A \cdot A^{n-1}$ for odd n and $(A^{n/2})^2$ for even n and calculating $A^n$ directly for n≤2.

Following are brief descriptions of the contents of each of the nine sections of the single-step transfer matrix 12 set out in FIG. 14. These should provide sufficient information to allow the matrix to be created in a form consistent with the invention:

Section F describes the impact of $V_i$ on $V'_i$, or, in short-hand notation, $V_i \rightarrow V'_i$: an offset identity matrix, to implement a pure shift (i.e. 0 for the first row and last column and an identity matrix for the rest), for each sub-section corresponding to one of the p sets of $V_i$ bits and the same set of $V'_i$ bits, with zeros for the rest.

Section G describes the impact of $V_s$ on $V'_i$, or, in short-hand notation, $V_s \rightarrow V'_i$: all zero.

Section H describes the impact of $V_o$ on $V'_i$, or, in short-hand notation, $V_o \rightarrow V'_i$: all zero.

Section I describes the impact of $V_i$ on, $V'_s$ or, in short-hand notation, $V_i \rightarrow V'_s$: zero except for the elements corresponding to the last set of p $V_i$ bits, which indicate how the input affects the state.

Section J describes the impact of $V_s$ on, $V'_s$ or, in short-hand notation, $V_s \rightarrow V'_s$: values indicating how the current state affects the next state.

Section K describes the impact of $V_o$ on, $V'_s$ or, in short-hand notation, $V_o \rightarrow V'_s$: all zero.

Section L describes the impact of $V_i$ on, $V'_o$ or, in short-hand notation, $V_i \rightarrow V'_o$: zero except for the elements corresponding to the last set of p $V_i$ bits and the first set of q $V'_o$ bits, which indicate how the input affects the output.

Section M describes the impact of $V_s$ on $V'_o$ or, in shorthand notation, $V_s \rightarrow V'_o$: zero except for the elements corresponding to the first set of q $V'_o$ bits, which indicate how the state affects the output.

Section N describes the impact of $V_o$ on $V_o$ or, in shorthand notation, $V_o \rightarrow V'_o$: an offset identity matrix, to implement a pure shift, for each sub-section corresponding to one of the q sets of $V_o$ bits and the same set of $V'_o$ bits, with zeros for the rest.

Although the present invention is described in this application primarily in terms of method and apparatus, it should be understood that the invention can readily be implemented as program code for execution through a suitable data processing resource, such as a DSP. This program code can be stored in any appropriate carrier, such as a ROM.

BRIEF DESCRIPTION OF THE DRAWINGS

By way of example only, certain embodiments of the invention will now be described with reference to the accompanying drawings, in which:

FIG. 2 illustrates a single step transfer matrix for the CRC checker of FIG. 1;

FIG. 3 illustrates a 32 step transfer matrix for the CRC checker of FIG. 1;

FIG. 9 illustrates a 32 cycle transfer matrix for the scrambling code generator of FIG. 7;

DETAILED DESCRIPTION

Figure 1:
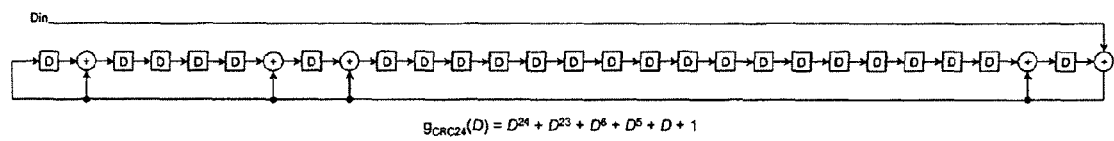
FIG. 1 illustrates an LFSR arranged as a CRC checker.

One embodiment of the present invention is a CRC generator and checker than can process 32 data bits at a time, as shown in FIG. 1.

FIG. 1 is a traditional LFSR-based implementation of CRC checker and generator hardware for the generator polynomial $D^{24}+D^{23}+D^{6}+D^{5}+D+1$. (This is the 24-bit CRC that is used for 3GPP.) The squares marked 'D' are flip-flops and the circles marked '+' are modulo-2 adders (i.e. exclusive-or gates).

FIG. 1 is a traditional implementation of a CRC generator and checker. Its initial state is all zeros. The data is presented one bit at a time as Din. After all the data has been presented, the state contains the CRC. If the correct CRC bits are presented after the data, the final state will be all zeros.

Figure 2:
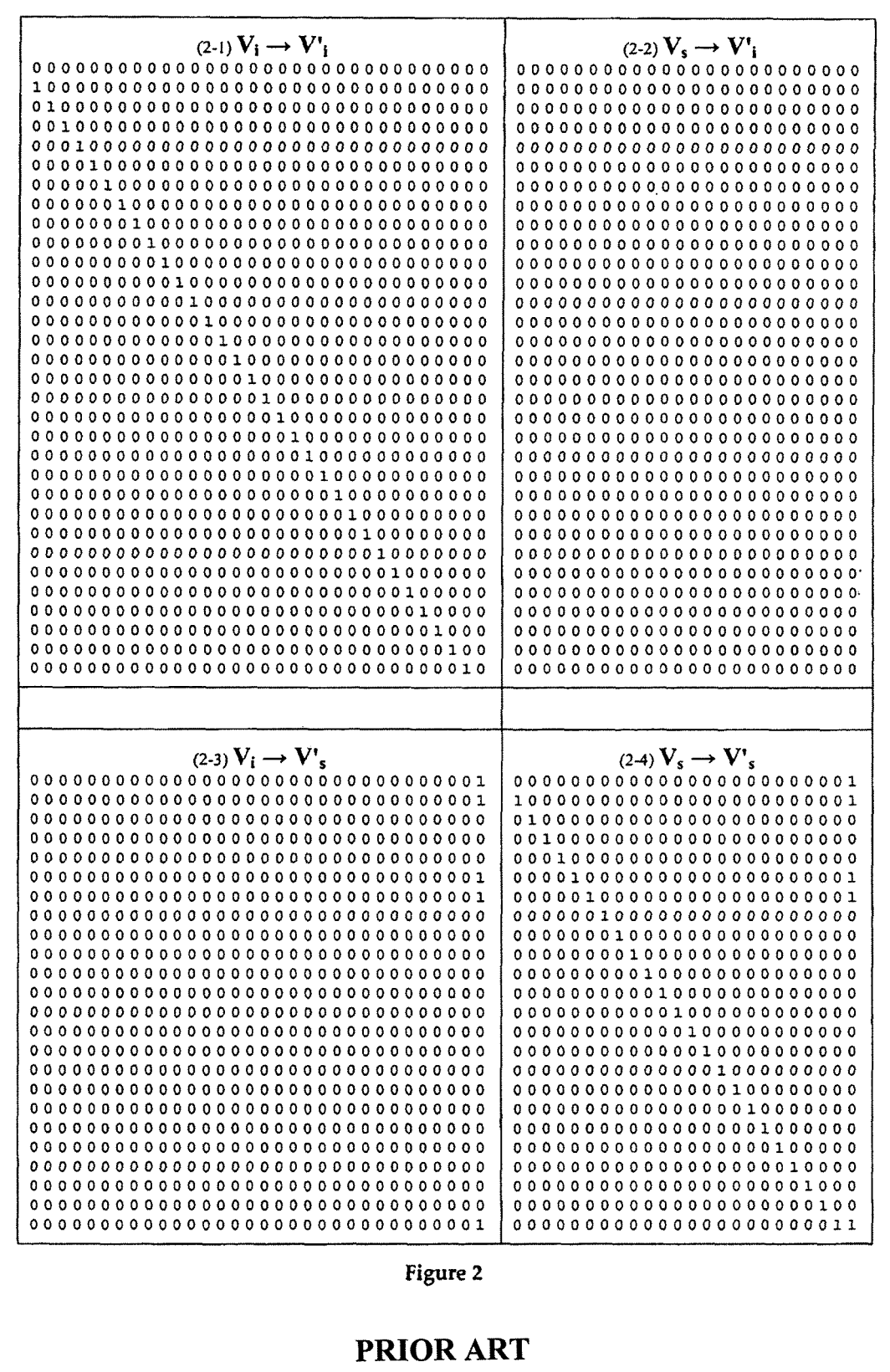

From this implementation the transfer matrix $A_{CRC}$ of FIG. 2 can be generated as described in the earlier list of bullet points. FIG. 2 is a transfer matrix, $A_{CRC}$, for the CRC generator polynomial of FIG. 1, with a total of 56 rows and columns so that it can be used to create a transfer matrix that processes 32 input bits at once. The sub-vector dimensions for this example are pn=1·32=32 for $V_i$, m=24 for $V_s$, and qn=0·32=0 for $V_o$. Each of $A_{CRC}$'s four sections is labelled according to the sub-vectors of the current and next state to which it relates. There are no sections for $V_i \rightarrow V'_o$, $V_s \rightarrow V'_o$, $V_o \rightarrow V'_i$, $V_o \rightarrow V'_s$, or $V_o \rightarrow V'_o$ because the CRC generator has no output bits. $A_{CRC}$ can be generated from the CRC generator polynomial automatically, for example with a simple Matlab script.

In order to make a CRC generator that can process n=32 input bits at a time, $A_{CRC}$ must be raised to the power n=32, producing the matrix $B_{CRC}$ of FIG. 3. Its four sections are also labelled with the relevant sub-vectors. Both sections (3-1) and (3-2) are all zeros, which means that $V'_i$ is always all zeros and therefore requires no storage elements or calculation. Sections (3-3) and (3-4) show how the n=32 input bits ($V_i$) and m=24 LFSR state bits ($V_s$) affect the m=24 next LFSR state bits ($V'_s$). $V_s$ requires m=24 storage elements, the same number used by the traditional implementation.

Figure 4:
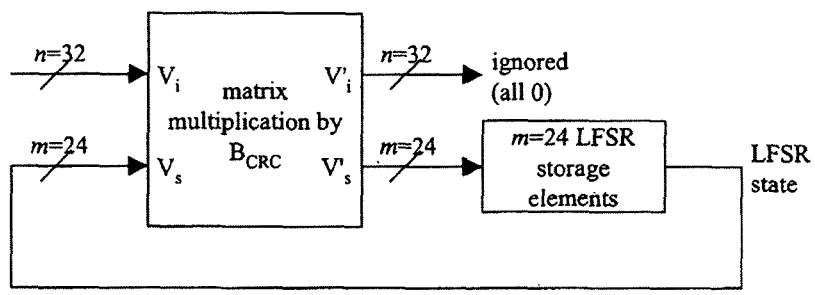
FIG. 4 illustrates apparatus for emulating a CRC checker in which a 32 cycle step of the LFSR is provided.

FIG. 4 shows a CRC circuit that uses $B_{CRC}$ to process 32 input bits at a time. The input data is presented in parallel, with 32 new bits appearing on each clock.

Figure 5:
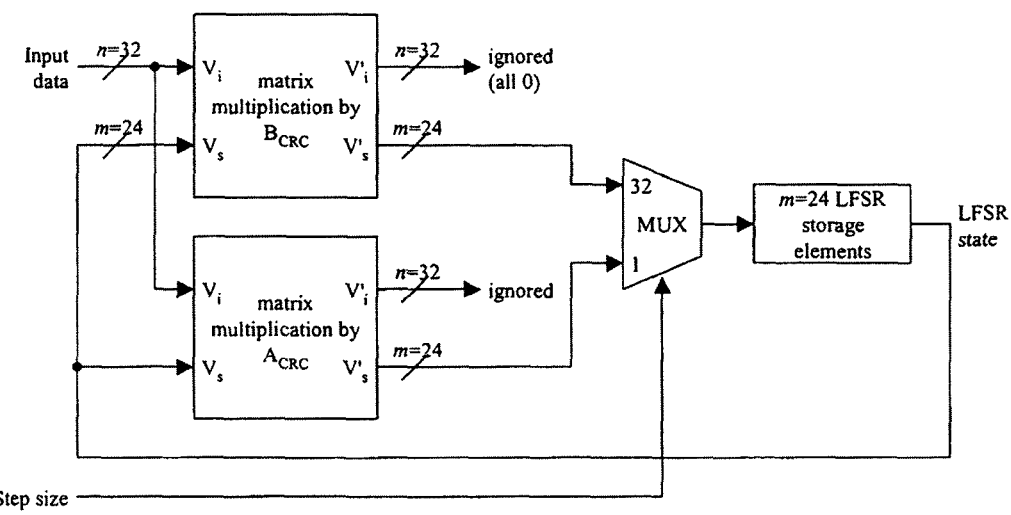
FIG. 5 illustrates apparatus for emulating an LFSR arranged as a CRC checker in which a single cycle or a 32 cycle shift to the LFSR can be selected.

FIG. 5 shows a CRC circuit that selectively uses $A_{CRC}$ and $B_{CRC}$ to process either one or 32 input bits at a time. The input data is still presented in parallel, but in one-bit mode, only the first bit affects the LFSR state (the input bit corresponding to the non-zero column of sub-matrix (2-3) of $A_{CRC}$—see FIG. 2). (For a typical implementation, in one-bit mode an external shift register would present the current bit in the correct position, with the rest of the 32-bit input ignored but filled with future bits, or arbitrary values when there are no more future bits.) In 32-bit mode 32 new bits appear on each clock. In a preferred embodiment, 32-bit mode would be used until fewer than 32 input bits remain. One-bit mode would then be used between 0 and 31 times (inclusive) to finish the CRC calculation. After this process, the LFSR state will contain the calculated CRC.

The matrix multiplications in FIG. 4 and FIG. 5 can be implemented easily and concisely in VHDL or Verilog. The fact that $V'_i$ is ignored in all cases allows the logic for that part of the multiplication to be omitted.

Another embodiment of the present invention is a scrambling-code generator that produces 32 code bits at a time.

Figure 6:
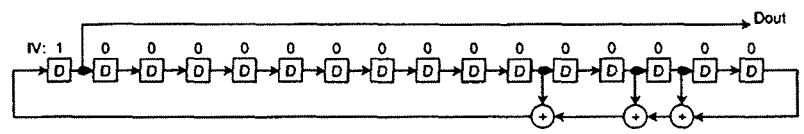
FIG. 6 illustrates an LFSR arranged as a scrambling code generator.

A traditional LFSR-based implementation of a certain scrambling-code generator is shown in FIG. 6. With the storage elements initialised as shown, the specified scrambling code is produced on Dout, starting with the initial '1' in the left-most storage element. (This produces the bit scrambling code used for 3GPP HSDPA.)

Figures 7, 8:
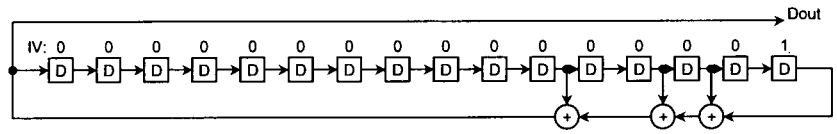
FIG. 7 illustrates another LFSR arranged as a scrambling code generator that produces the same scrambling code as the generator shown in FIG. 6.
FIG. 8 illustrates a single cycle transfer matrix for the scrambling code generator of FIG. 7.

A more efficient implementation of the present invention is possible when the LFSR storage elements are also a shift register of the output value. FIG. 7 has been modified to make this true, while producing the same scrambling code output as FIG. 6. It can easily be seen by inspection that, for a given starting state, FIG. 6 and FIG. 7 produce the same sequence of states, but that the output of FIG. 6 is delayed by one clock with respect to that of FIG. 7. Since only the output (and not the state) is important for a scrambling-code generator, the initial values in FIG. 7 have been changed so that its sequence of states precedes that of FIG. 6 by a single cycle, thus making the two implementations produce the same output sequence. (In the original version, only the last 15 outputs are available from the storage elements.) Note that the state sequences produced by the code generators of FIG. 6 and FIG. 7 will be offset from each other by one clock. This is not an important difference because only the output sequences will be used, and they will be identical.

The transfer matrix $A_{SCR}$ of FIG. 8 is derived from the circuit of FIG. 7 in accordance with the list of bullet points given earlier. The sub-vector dimensions for this example are pn=0·32=0 for $V_i$, m=16 for $V_s$, and qn=1·32=32 for $V_o$. Because the LFSR state is also the last 16 output bits, the first half of $V_o$ ($V_{o(1:16)}$) is identical to $V_s$, and therefore only the last half of $V_o$ ($V_{o(17:32)}$) is included explicitly in the matrix. Each of $A_{SCR}$'s four sections is labelled according to the sub-vectors of the current and next state to which it relates. There are no sections for $V_i \rightarrow V'_i$, $V_i \rightarrow V'_s$, $V_i \rightarrow V'_o$, $V_s \rightarrow V'_i$, or $V_o \rightarrow V'_i$ because the scrambling-code generator has no input bits.

In order to make a scrambling-code generator that can produce n=32 output bits at a time, $A_{SCR}$ must be raised to the power n=32, producing the matrix $B_{SCR}$ of FIG. 9. Its four sections are also labelled with the relevant sub-vectors. Both sections (9-2) and (9-4) are all zeros, which means that $V_o$ never contributes to $V'_s$ or $V'_o$ and therefore requires no storage elements or calculation. Sections (9-1) and (9-3) show how the m=16 LFSR state bits ($V_s$) affect the m=16 next LFSR state bits ($V'_s$) and n=32 next output bits ($V'_{o(1:16)}=V'_s$ and $V'_{o(17:32)}$). $V_s$ requires m=16 storage elements, the same number used by the traditional implementation.

Figure 10:
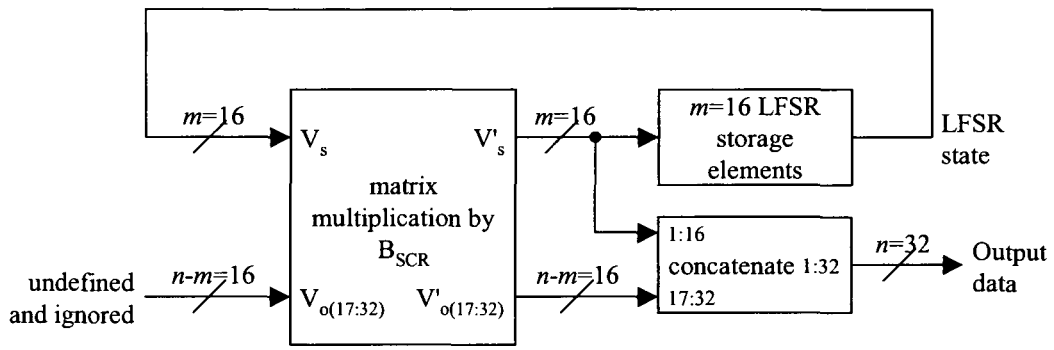
FIG. 10 illustrates apparatus for emulating the scrambling code generator of FIG. 7, in which a 32 cycle step to the LFSR state is provided.

FIG. 10 shows a scrambling-code generator circuit that uses $B_{SCR}$ to produce 32 code bits at a time. On each clock, 32 new scrambling-code bits appear at the output. If the total number of scrambling-code bits required is not a multiple of 32, the preferred embodiment simply ignores the last few scrambling-code bits. This is more efficient than selecting between two or more generator matrices to produce exactly the required number of bits.

The matrix multiplication in FIG. 10 can be implemented easily and concisely in VHDL or Verilog. The fact that $V_{o(17:32)}$ is multiplied by 0 and is therefore ignored in all cases means that no logic is required for that part of the multiplication and $V_{o(17:32)}$ can be omitted.

Figure 11:
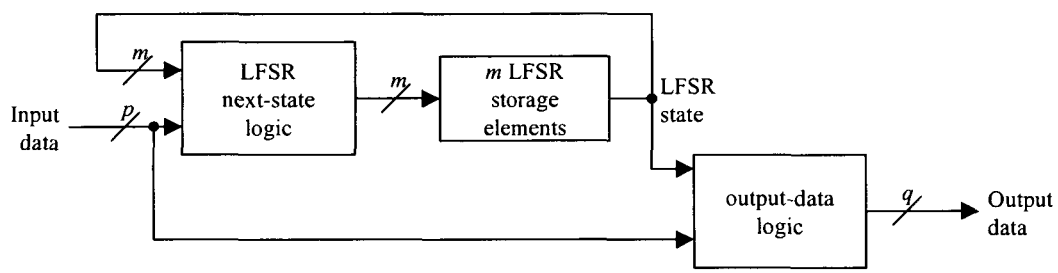
FIG. 11 illustrates schematically a prior art LFSR.
Figure 12:
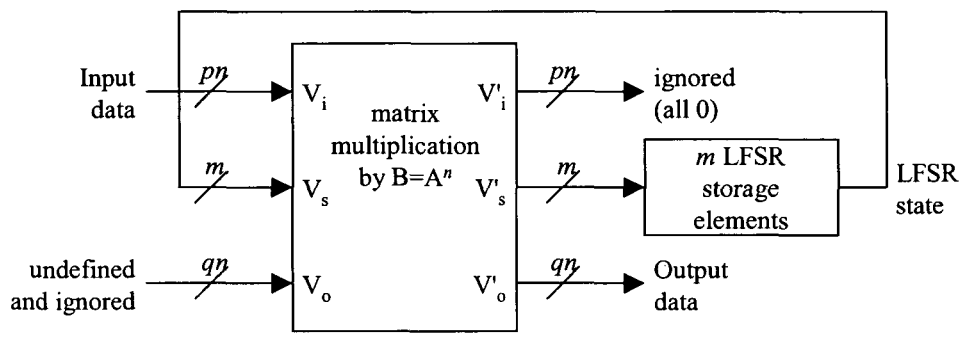
FIG. 12 illustrates a general n step LFSR in accordance with an embodiment of the invention.

A more general traditional LFSR, with m state bits, p input bits, and q output bits, is shown in FIG. 11. A circuit for the corresponding multi-stepping implementation is shown in FIG. 12. The transfer matrix B is generated by raising A to the $n^{th}$ power (modulo 2), where A is derived from the original LFSR in accordance with the list of bullet points given earlier. Of the 9 sections of B, the 5 associated with $V_o$, $V'_i$, or both ($V_i \rightarrow V'_i$, $V_s \rightarrow V'_i$, $V_o \rightarrow V'_i$, $V_o \rightarrow V'_s$, and $V_o \rightarrow V'_o$) are all zeros, which allows the input $V_o$ and the output $V'_i$ of the matrix multiplication to be omitted.

Figure 13:
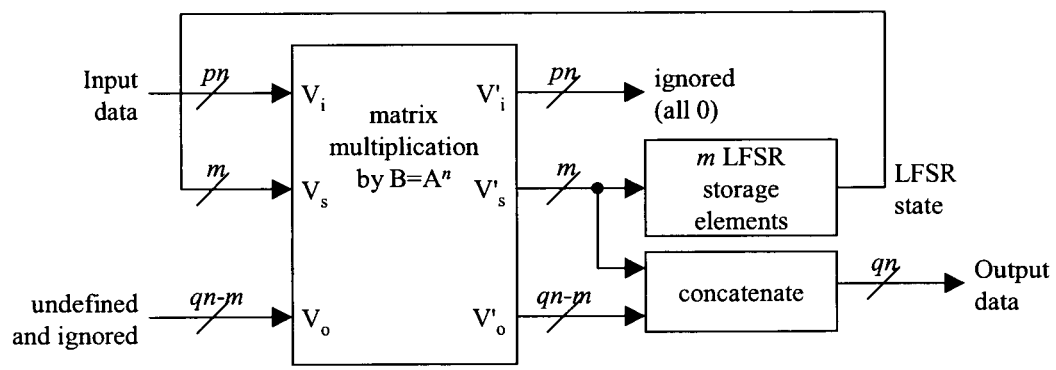
FIG. 13 illustrates a general n step LFSR with shared output and LFSR content state vector sections in accordance with an embodiment of the present invention.
Figure 14:
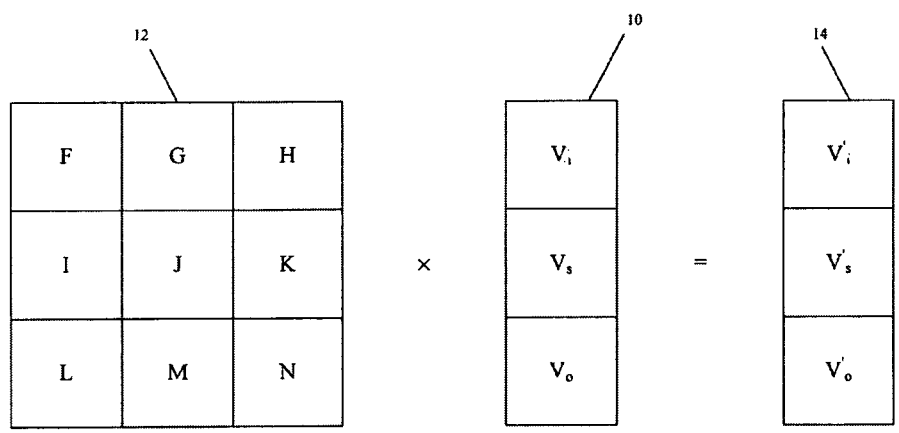
FIG. 14 illustrates the general form of a time shift matrix for application to a state vector in an LFSR emulation.

FIG. 12 is not completely general, in that it does not show the special case of shared LFSR state bits and output-data shift register bits. This case is described above and is shown in FIG. 13.

The invention claimed is:

1. Apparatus for emulating the operation of a linear-feedback shift register (LFSR) having at least one of one or more inputs and one or more outputs, wherein the state of the LFSR is described by a state vector having sections describing the input or inputs of the LFSR, the contents of the LFSR and the output or outputs of the LFSR, wherein the state vector is multiplied by a time shift matrix to time shift the state specified by the vector and the apparatus comprises:

an electronic matrix multiplier configured to multiply a first instance of the state vector by the matrix to produce a second instance of the state vector that is time shifted relative to the first instance, wherein one or both of the input and output sections of the state vector are dimensioned to accommodate, respectively, inputs that arrive at different times during the time shift specified by the matrix and outputs that are produced at different times during the time shift; and a shift register configured to store outputs of the electronic matrix multiplier, wherein the matrix is split into individual components describing transitions between input, state and output parts of initial and final versions of the state and output parts of the state vector, and wherein components of the matrix which do not impact a final version of the state and output parts of the state vector are ignored.

2. The apparatus according to claim 1, wherein the time shift specified by the matrix extends to multiple cycles of the emulated LFSR.

3. The apparatus according to claim 1, wherein the emulated LFSR is a cyclic redundancy check (CRC) generator or checker or a scrambling code generator.

4. The apparatus according to claim 1, wherein there is an overlap between the LFSR content and output sections of the state vector and the state vector is shortened to eliminate a duplicated overlap.

5. The apparatus of claim 1, wherein the matrix is split into 9 different sections.

6. Apparatus for emulating the operation of a linear-feedback shift register (LFSR) having at least one of one or more inputs and one or more outputs, wherein the state of the LFSR is described by a state vector having sections describing the input or inputs of the LFSR, the contents of the LFSR and the output or outputs of the LFSR, wherein the state vector is multiplied by a time shift matrix to time shift the state specified by the vector and the apparatus comprises:

an electronic matrix multiplier configured to multiply a first instance of the state vector by the matrix to produce a second instance of the state vector that is time shifted relative to the first instance, wherein the multiplication extends only to those parts of the matrix that describe the impact of the LFSR content and input sections of first instance of the state vector upon the LFSR content and output sections of the second instance; and a shift register configured to store outputs of the electronic matrix multiplier, wherein the matrix is split into individual components describing transitions between input, state and output parts of initial and final versions of the state and output parts of the state vector, and wherein components of the matrix which do not impact a final version of the state and output parts of the state vector are ignored.

7. The apparatus according to claim 6, wherein the time shift specified by the matrix extends to multiple cycles of the emulated LFSR.

8. The apparatus according to claim 6, wherein the emulated LFSR is a cyclic redundancy check (CRC) generator or checker or a scrambling code generator.

9. The apparatus according to claim 6, wherein there is an overlap between the LFSR content and output sections of the state vector and the state vector is shortened to eliminate a duplicated overlap.

10. The apparatus of claim 6, wherein the matrix is split into 9 different sections.

11. A method of emulating the operation of a linear-feedback shift register (LFSR) having at least one of one or more inputs and one or more outputs, wherein the state of the LFSR is described by a state vector having sections describing the input or inputs of the LFSR, the contents of the LFSR and the output or outputs of the LFSR, wherein the state vector is multiplied by a time shift matrix to time shift the state specified by the vector and the apparatus comprises:

multiplying, using an electronic matrix multiplier, a first instance of the state vector by the matrix to produce a second instance of the state vector that is time shifted relative to the first instance, wherein one or both of the input and output sections of the state vector are dimensioned to accommodate, respectively, inputs that arrive at different times during the time shift specified by the matrix and outputs that are produced at different times during the time shift; and storing outputs of the electronic matrix multiplier in a shift register, wherein the matrix is split into individual components describing transitions between input, state and output parts of initial and final versions of the state and output parts of the state vector, and wherein components of the matrix which do not impact a final version of the state and output parts of the state vector are ignored.

12. The method according to claim 11, wherein the time shift specified by the matrix extends to multiple cycles of the emulated LFSR.

13. The method according to claim 11, wherein the emulated LFSR is a cyclic redundancy check (CRC) generator or checker or a scrambling code generator.

14. The method according to claim 11, wherein there is an overlap between the LFSR content and output sections of the state vector and the state vector is shortened to eliminate a duplicated overlap.

15. The method of claim 11, wherein the matrix is split into 9 different sections.

16. A method of emulating the operation of a linear-feedback shift register (LFSR) having at least one of one or more inputs and one or more outputs, wherein the state of the LFSR is described by a state vector having sections describing the input or inputs of the LFSR, the contents of the LFSR and the output or outputs of the LFSR, wherein the state vector is multiplied by a time shift matrix to time shift the state specified by the vector and the apparatus comprises:

time shifting a first instance of the state vector to produce a second instance of the state vector by multiplying, using an electronic matrix multiplier, the first instance of the state vector with the matrix, wherein said multiplication extending only to those parts of the matrix that describe the impact of the LFSR content and input sections of first instance of the state vector upon the LFSR content and output sections of the second instance; and storing outputs of the electronic matrix multiplier in a shift register, wherein the matrix is split into individual components describing transitions between input, state and output parts of initial and final versions of the state and output parts of the state vector, and wherein components of the matrix which do not impact a final version of the state and output parts of the state vector are ignored.

17. The method according to claim 16, wherein the time shift specified by the matrix extends to multiple cycles of the emulated LFSR.

18. The method according to claim 16, wherein the emulated LFSR is a cyclic redundancy check (CRC) generator or checker or a scrambling code generator.

19. The method according to claim 16, wherein there is an overlap between the LFSR content and output sections of the state vector and the state vector is shortened to eliminate a duplicated overlap.

20. The method of claim 16, wherein the matrix is split into 9 different sections.

* * * * *